(12) United States Patent
Metzler et al.

(10) Patent No.: US 12,020,949 B2
(45) Date of Patent: Jun. 25, 2024

(54) SUBTRACTIVE PATTERNING OF INTERCONNECT STRUCTURES

(71) Applicant: International Business Machines Corporation, Armonk, NY (US)

(72) Inventors: Dominik Metzler, Clifton Park, NY (US); Somnath Ghosh, Clifton Park, NY (US); John Christopher Arnold, North Chatham, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 17/447,388

(22) Filed: Sep. 10, 2021

(65) Prior Publication Data

US 2023/0084739 A1    Mar. 16, 2023

(51) Int. Cl.
*H01L 21/3213*    (2006.01)
*H01L 21/768*    (2006.01)
*G06F 30/3953*    (2020.01)

(52) U.S. Cl.
CPC .... *H01L 21/32139* (2013.01); *H01L 21/7684* (2013.01); *H01L 21/7685* (2013.01); *H01L 21/76885* (2013.01); *G06F 30/3953* (2020.01)

(58) Field of Classification Search
CPC .......... H01L 21/32139; H01L 21/7684; H01L 21/7685; H01L 21/76885; H01L 21/76897; G06F 30/3953
See application file for complete search history.

(56) References Cited

U.S. PATENT DOCUMENTS

| 8,357,609 | B2 | 1/2013 | Ryan |
| 8,992,792 | B2 | 3/2015 | Chang et al. |
| 9,601,426 | B1 | 3/2017 | Bonilla et al. |
| 9,607,886 | B1 | 3/2017 | Burns et al. |
| 9,761,489 | B2 | 9/2017 | Mebarki et al. |
| 9,773,676 | B2 | 9/2017 | Chang et al. |
| 9,875,138 | B2 * | 1/2018 | State ..................... G06F 9/4881 |
| 10,157,789 | B2 | 12/2018 | Chen et al. |
| 10,177,031 | B2 | 1/2019 | Bao et al. |
| 10,685,879 | B1 * | 6/2020 | Arnold ............. H01L 21/76897 |

(Continued)

FOREIGN PATENT DOCUMENTS

KR    20170103204 A    9/2017

OTHER PUBLICATIONS

International Search Report and Written Opinion, International Application No. PCT/CN2022/103209, 8 pgs, Aug. 25, 2022.

*Primary Examiner* — Karen Kusumakar
(74) *Attorney, Agent, or Firm* — Stosch Sabo

(57) ABSTRACT

A method of making a back-end-of-line (BEOL) component includes filling spaces in a layer of metal material and a layer of hardmask material with a layer of scaffolding material. The method further includes forming at least one plug on top of the layer of metal material such that the at least one plug is integrally formed with the layer of scaffolding material. The method further includes removing the layer of hardmask material such that a top surface of the layer of metal material is exposed except where the at least one plug is formed on top of the layer of metal material. The method further includes recessing the layer of metal material where the top surface of the layer of metal material is exposed. The method further includes removing the scaffolding material.

20 Claims, 12 Drawing Sheets

(56) References Cited

U.S. PATENT DOCUMENTS

| | | |
|---|---|---|
| 2019/0019748 A1* | 1/2019 | Wallace ............ H01L 21/76834 |
| 2019/0157082 A1 | 5/2019 | Fan et al. |
| 2019/0318968 A1 | 10/2019 | Seo et al. |
| 2021/0082746 A1 | 3/2021 | Arnold et al. |
| 2021/0098287 A1 | 4/2021 | Park et al. |
| 2021/0143013 A1 | 5/2021 | Liu et al. |
| 2021/0242077 A1 | 8/2021 | Brown et al. |

* cited by examiner

SUBTRACTIVE PATTERNING OF INTERCONNECT STRUCTURES

BACKGROUND

The present disclosure relates to the electrical, electronic, and computer fields. In particular, the present disclosure relates to the interconnects of semiconductor devices and methods of making the interconnects of semiconductor devices.

SUMMARY

Embodiments of the present disclosure include a method of making a back-end-of-line (BEOL) component. The method includes filling spaces in a layer of metal material and a layer of hardmask material with a layer of scaffolding material. The method further includes forming at least one plug on top of the layer of metal material such that the at least one plug is integrally formed with the layer of scaffolding material. The method further includes removing the layer of hardmask material such that a top surface of the layer of metal material is exposed except where the at least one plug is formed on top of the layer of metal material. The method further includes recessing the layer of metal material where the top surface of the layer of metal material is exposed. The method further includes removing the scaffolding material.

Additional embodiments of the present disclosure include a computerized system for making a BEOL component. The system includes a memory and a processor communicatively coupled to the memory. The processor is configured to perform a method. The method includes filling spaces in a layer of metal material and a layer of hardmask material with a layer of scaffolding material. The method further includes forming at least one plug on top of the layer of metal material such that the at least one plug is integrally formed with the layer of scaffolding material. The method further includes removing the layer of hardmask material such that a top surface of the layer of metal material is exposed except where the at least one plug is formed on top of the layer of metal material. The method further includes recessing the layer of metal material where the top surface of the layer of metal material is exposed. The method further includes removing the scaffolding material.

Additional embodiments of the present disclosure include a method for making a BEOL component. The method includes depositing a metal layer on a substrate. The method further includes patterning the metal layer to form one or more conductive elements. The method further includes forming a scaffolding structure including a plug arranged on top of a portion of the patterned metal layer. The method further includes selectively recessing the metal layer such that the portion of the patterned metal layer covered by the plug is not recessed. The method further includes removing the scaffolding structure.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2I illustrates an example of a component following the performance of a portion of the example method of FIG. 1, in accordance with embodiments of the present disclosure.

DETAILED DESCRIPTION

Figure 1:
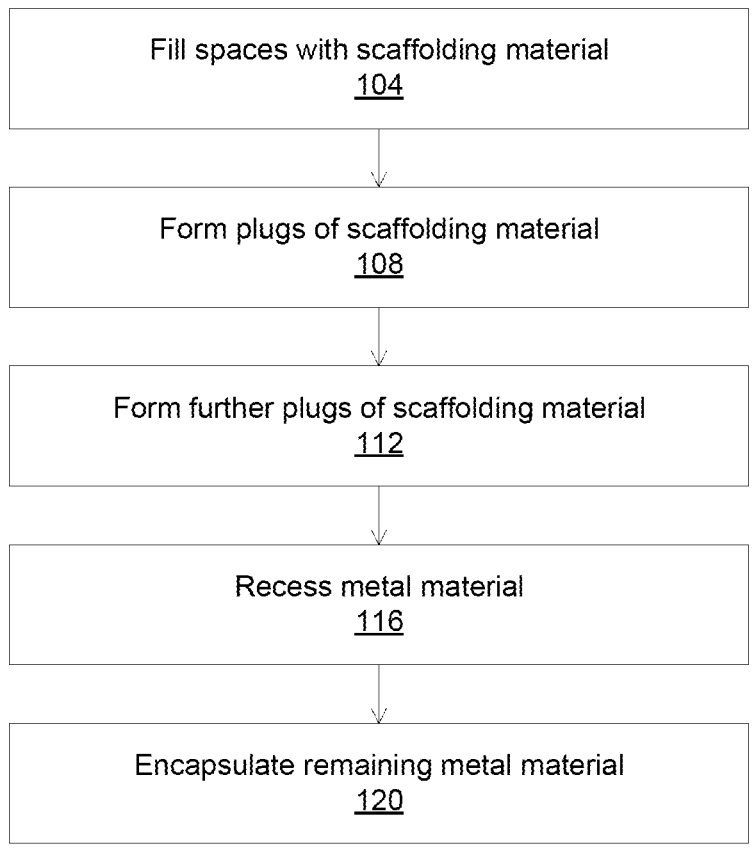
FIG. 1 illustrates a flowchart of an example method for forming a BEOL component, in accordance with embodiments of the present disclosure.

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, interconnects are structures that connect two or more circuit elements (such as transistors or power rails) together electrically. In addition to providing the electrical connection to the front end devices (such as transistors), interconnects also go all the way back to the power delivery networks. Thus, interconnects, and their surrounding support components, are considered back-end-of-line (BEOL) components. Lines and vias are the most important components of interconnect technology. Lines provide electrical connection within a single layer, and vias provide electrical connection between layers in a physical electronic circuit.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming lines and vias. A damascene flow refers to the processes of forming line and via structures by depositing an oxide layer, forming a trench into the oxide layer, and then depositing metal into the trench. Alternatively, a subtractive flow refers to processes of forming line and via structures by depositing metal, and then etching the metal to form lines and vias. One benefit of a subtractive flow is the absence of an interface between the lines and vias because they were formed at the same time during a single, initial deposition of metal material.

Fabrication processes such as those discussed above may impose practical limitations on the resulting structures. For example, the minimum size of a structure may be limited by the fineness or selectivity of the procedures able to be performed.

One of the geometric properties of an interconnect structure is the pitch, which refers to the distance between the center of the width of one interconnect structure and the center of the width of an adjacent interconnect structure on the same level. Accordingly, the pitch is dependent upon the width and spacing of the interconnects, and the pitch, width, and spacing of the interconnects are ultimately constrained by design rules which ensure that the interconnect can be fabricated with a reasonable yield. For example, the width may be constrained by a minimum to prevent interconnect breakage and by a maximum to ensure that interconnects can be planarized by CMP. The spacing may be constrained by a minimum to ensure that interconnects can be fabricated without unintended conductive material bridging.

As technology continues to be scaled, and transistors are becoming smaller, increasingly tightly spaced interconnects are required to connect to them. Scaling interconnects pushes the boundaries of minimum widths, minimum spacings, and minimum pitches. However, these decreasing sizes and increasing densities introduce performance and reliability issues. In particular, critical dimensions refer to the sizes of electronic components that must be maintained to avoid unwanted impact on the electrical properties of the device. Accordingly, the geometric properties of interconnect structures are limited not only by fabrication constraints, but also by performance constraints.

One particular issue that arises when the interconnect pitch is scaled to below 30 nanometers is that the aspect ratio of via structures becomes problematically fragile and prone to collapse and damage. The aspect ratio of via structures refers to the ratio of the height to the width. The height of the via structures must be sufficient to provide electrical connection between layers. Accordingly, the height cannot necessarily be reduced at the same rate or to the same extent as the width when interconnect structures are scaled down in size. When the width is reduced more than the height, the vias become flimsy and fragile. The effect is especially pronounced when the interconnect pitch is scaled to below 30 nanometers, because in order to have a pitch that is below 30 nanometers, the width of the interconnect structures must be scaled below a particular threshold.

The flimsiness and fragility of the vias makes them especially prone to collapse and damage when the interconnect structures are formed with a subtractive flow. More specifically, because a subtractive flow forms lines and vias by depositing metal and then etching the metal, the full height of all of the lines and vias is formed at once. This results in tall, free-standing vias that are exposed and unsupported, which makes them prone to damage due to their high aspect ratio. Damage can include or lead to missing vias, extraneous vias, pattern collapse, and high rates of defects.

Moreover, mask material, which is used to cover the vias while the height of the layer of metal material is recessed to form the lines, is arranged on top of the vias, which means that it is even taller and more unsupported than the underlying vias. Such tall mask structures are therefore also prone to damage, including collapse and high corner erosion. Damage to the mask material can result in defects to the vias and lines being formed using the mask material.

Embodiments of the present disclosure may overcome these and other drawbacks of existing solutions by utilizing a scaffolding material between lines that will provide improved structural support and stability to the vias during fabrication. As discussed in further detail below, such embodiments include filling spaces in a layer of metal material and a layer of hardmask material with a scaffolding material, forming plugs of scaffolding material on top of the layer of metal material, removing the hardmask material, recessing the metal layer except where the plugs are on top of the metal material, and then removing the scaffolding material.

In such embodiments, the plugs of scaffolding material act as masks. The plugs are structurally supported by surrounding scaffolding material, which reduces the likelihood of damage to the mask. Additionally, the surrounding scaffolding material also provides structural support for the vias. Such embodiments provide improved structural support for interconnect structures having an aspect ratio that is 3:1 or greater, in particular. Accordingly, such embodiments enable subtractive metal patterning without an interface between metal lines and top vias by recessing tall line structures with scaffolding material acting as a via hardmask. Additionally, such embodiments reduce the likelihood of damage and collapse to the fabrication support structures and the interconnect structures, even at small dimensions and/or high aspect ratios. Therefore, such embodiments enable mechanically robust patterning for structures having a pitch that is less than or equal to 30 nanometers, thereby reducing the likelihood of fabrication defects and facilitating improved reliability, yield, and performance. Accordingly, embodiments of the present disclosure facilitate saving resources including time and money.

This disclosure pertains to a subtractive scheme (also referred to as a subtractive flow) in which a layer of metal material is deposited on a substrate, some of the metal material is selectively etched away to leave behind lines of the metal material, and vias are formed on top of the lines.

FIG. 1 depicts an example method 100 of forming a BEOL component. In accordance with at least some embodiments of the present disclosure, a subtractive flow, such as that discussed above, is performed prior to beginning the method 100. More specifically, prior to the performance of operation 104, a layer of metal material is formed on a substrate, an adhesion layer is formed on the layer of metal material, and a layer of hardmask material is formed on the adhesion layer. The layer of hardmask material includes spaces, and the arrangement of the hardmask material and spaces determines where the layer of metal material is removed and where it remains. In particular, portions of the layer of metal material (and the adhesion layer) that are not directly beneath the hardmask material (are directly beneath spaces) are removed, and portions of the layer of metal material (and the adhesion layer) that are directly beneath the hardmask material remain intact. The portions of the layer of metal material that remain intact form the lines of the BEOL component, and the lines are separated by spaces from which the layer of metal material was removed. In accordance with at least some alternative embodiments of the present disclosure, the method 100 can include performing such a subtractive flow.

Figure 2A:
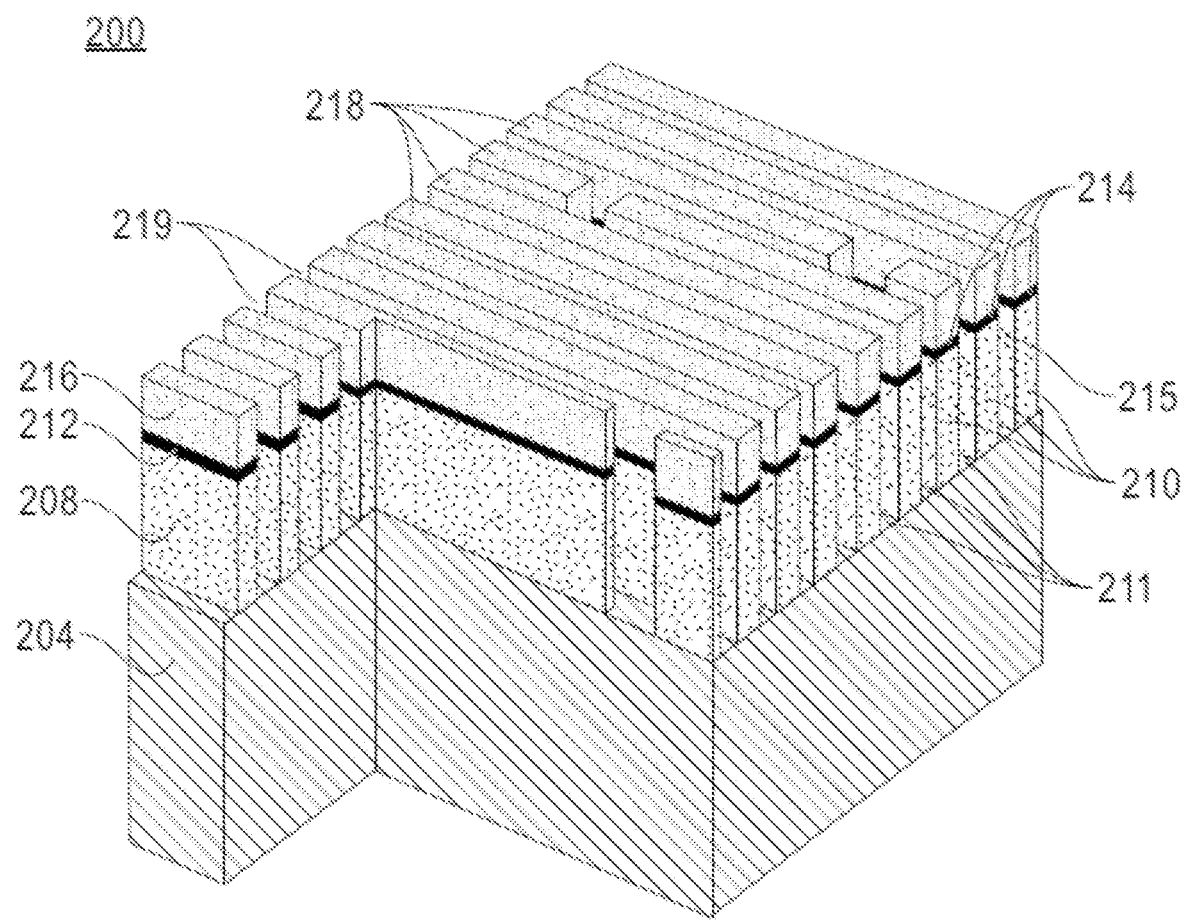
FIG. 2A illustrates an example of a component following the performance of a portion of the example method of FIG. 1, in accordance with embodiments of the present disclosure.

FIG. 2A depicts an example structure 200 following the performance of the subtractive flow described above. The structure 200 includes a substrate 204 and a layer of metal material 208 formed in direct contact with the substrate 204. In accordance with at least one embodiment of the present disclosure, the substrate 204 can be made of, for example, silicon or another material having similar relevant material properties. In accordance with at least one embodiment of the present disclosure, the layer of metal material 208 can be made of, for example, ruthenium or another material having similar relevant material properties. Due to the patterning formed by the performance of the subtractive flow, the layer of metal material 208 includes line portions 210, where the metal material remains, and spaces 211 between the line portions, where the metal material has been removed.

The structure 200 also includes an adhesion layer 212 formed in direct contact with the layer of metal material 208. In accordance with at least one embodiment of the present disclosure, the adhesion layer 212 can be made of, for example, silicon nitride, silicon carbon nitride, silicon monoxide, or another material having similar relevant material properties. The adhesion layer 212 is patterned in the same manner as the layer of metal material 208 in the performance of the subtractive flow. Accordingly, the adhesion layer 212 also includes line portions 214 that are vertically aligned with the line portions 210 of the metal material and spaces 215 that are vertically aligned with the spaces 211 in the layer of metal material 208.

The structure 200 also includes a layer of hardmask material 216, which provides the pattern for the subtractive flow. Accordingly, the layer of hardmask material 216 also includes line portions 218 that are aligned with the line portions 210 and 214 and spaces 219 that are aligned with the spaces 211 and 215. The layer of hardmask material 216 is formed in direct contact with the adhesion layer 212. In accordance with at least one embodiment of the present disclosure, the layer of hardmask material can be made of, for example, titanium nitride, tantalum nitride, silicon monoxide, or another material having similar relevant material properties.

Returning to FIG. 1, at operation 104, the spaces in the layer of metal material, the adhesion layer, and the layer of hardmask material are filled with a scaffolding material. The scaffolding material forms ribs in direct contact with the top surface of the substrate as well as exposed vertical surfaces of the layer of metal material, the adhesion layer, and the layer of hardmask material. The scaffolding material provides structural stability for the layer of metal material as well as subsequently applied materials during subsequent fabrication processes.

In accordance with at least one embodiment of the present disclosure, filling the spaces includes applying the scaffolding material to the structure such that the scaffolding material fills the spaces and covers the top of the layer of hardmask material. Such embodiments increase the likelihood that the scaffolding material will completely fill the spaces. Accordingly, such embodiments provide robust and consistent structural support for subsequent fabrication processes.

In accordance with at least one embodiment of the present disclosure, filling the spaces further includes removing the portion of the scaffolding material that covers the top of the layer of hardmask material. Such embodiments result in a planarized, level surface wherein the layer of hardmask material and the scaffolding material are substantially co-planar with one another. In accordance with at least one alternative embodiment of the present disclosure, filling the spaces further includes leveling the portion of the scaffolding material that covers the top of the layer of hardmask material. Such embodiments result in a planarized, level surface of scaffolding material. In either case, such embodiments provide robust and consistent structural support for subsequent fabrication processes.

Figure 2B:
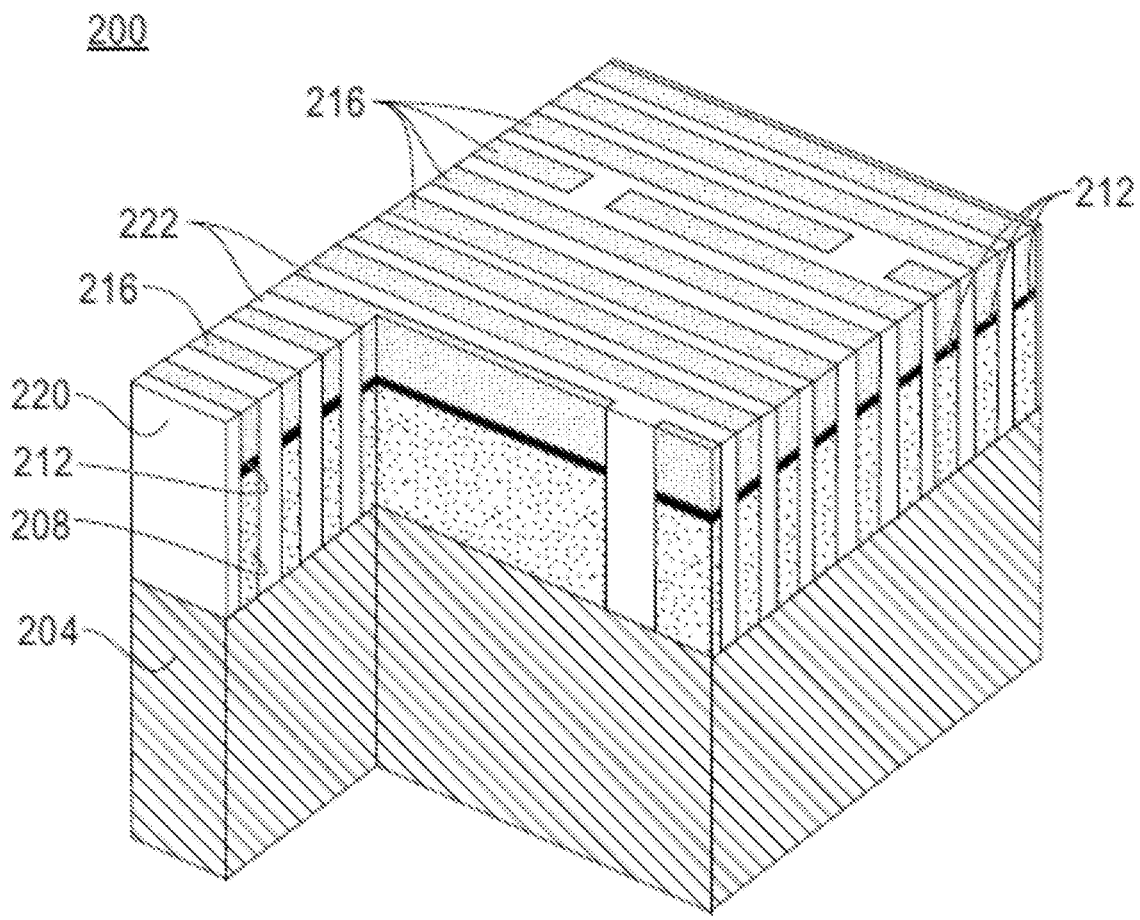
FIG. 2B illustrates an example of a component following the performance of a portion of the example method of FIG. 1, in accordance with embodiments of the present disclosure.

FIG. 2B depicts the example structure 200 following the performance of operation 104. As shown, the spaces 211, 215, and 219 (shown in FIG. 2A) have been filled with scaffolding material 220. In accordance with at least one embodiment of the present disclosure, the scaffolding material 220 can be made of, for example, a spin-on-glass (SoG) material, an organic planarization layer (OPL) material, silicon carbon nitride, or another material having similar relevant material properties.

As shown in FIG. 2B, following the performance of operation 104, the top surfaces of the layer of hardmask material 216 and the scaffolding material 220 are substantially co-planar with one another. Additionally, the scaffolding material 220 forms ribs 222 extending from the co-planar top surfaces down to the substrate 204.

Returning to FIG. 1, at operation 108, plugs of scaffolding material are formed. The plugs provide masking for the metal material during subsequent fabrication processes. In accordance with at least one embodiment of the present disclosure, the performance of operation 108 includes the performance of a number of sub-operations such as lithography, pattern transfer, filling, and etching.

In particular, in accordance with at least one embodiment of the present disclosure, the performance of operation 108 includes forming a planarization layer in direct contact with the top surface of the scaffolding material. For embodiments in which the top surface of the scaffolding material is substantially co-planar with the top surface of the layer of hardmask material, the planarization layer is also applied such that it is in direct contact with the top surface of the hardmask material.

In accordance with at least one embodiment of the present disclosure, the performance of operation 108 further includes applying a silicon containing anti-reflective coating (SiARC) layer in direct contact with the planarization layer.

In accordance with at least one embodiment of the present disclosure, the performance of operation 108 further includes applying a photoresist layer in direct contact with the SiARC layer. The photoresist layer includes a pattern having at least one opening, which will be transferred down through the SiARC layer, through the planarization layer, through the layer of hardmask material, and through the adhesion layer to the top surface of the layer of metal material. Accordingly, the at least one opening extends through the photoresist layer down to the SiARC layer.

Figure 2C:
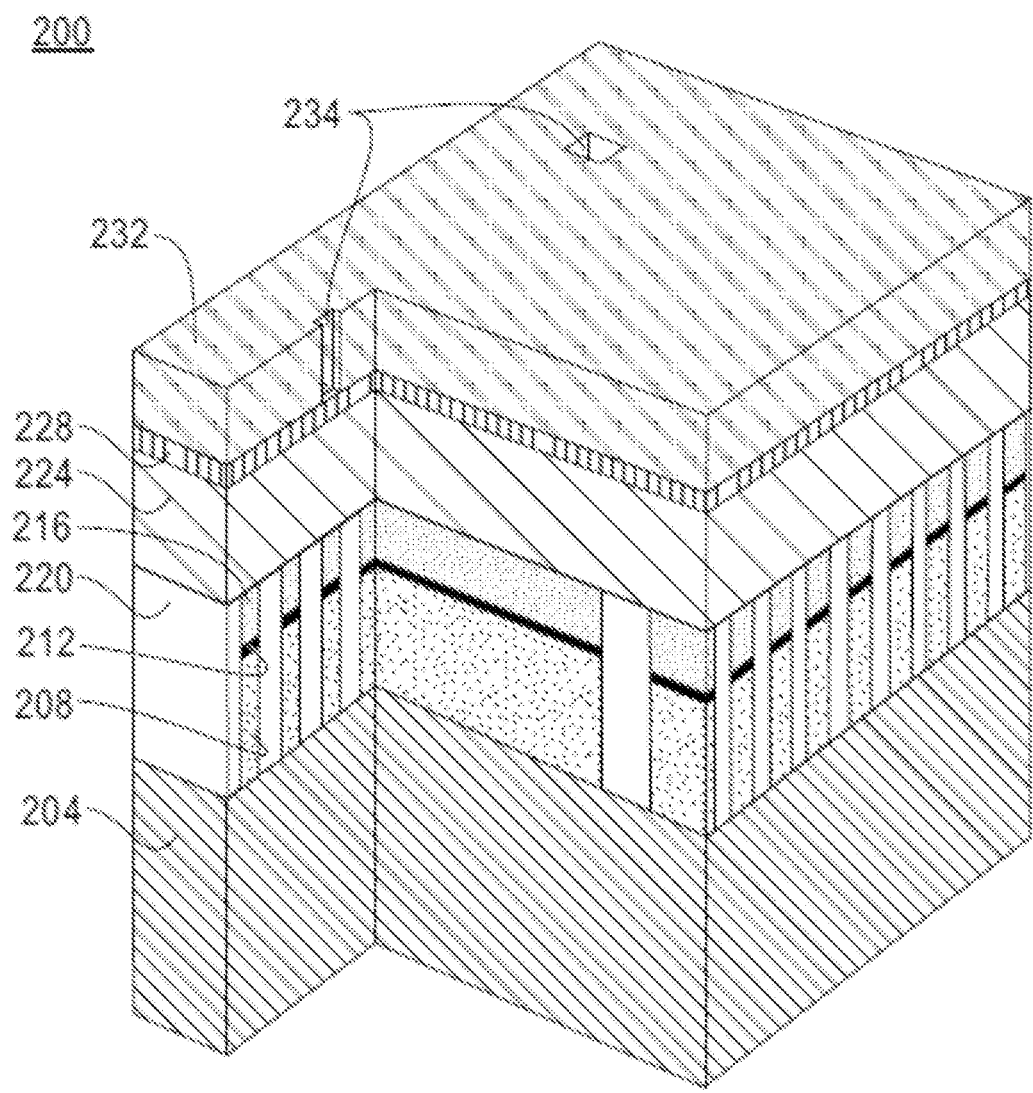
FIG. 2C illustrates an example of a component following the performance of a portion of the example method of FIG. 1, in accordance with embodiments of the present disclosure.

FIG. 2C depicts the structure 200 following the performance of these sub-operations of operation 108. As shown, the structure 200 includes a planarization layer 224, a SiARC layer 228, and a photoresist layer 232. The photoresist layer 232 includes openings 234 formed therein. The openings 234 extend through the entire photoresist layer 232 and down to the SiARC layer 228.

Returning to FIG. 1, in accordance with at least one embodiment of the present disclosure, the performance of operation 108 further includes transferring the pattern of the photoresist layer down through the SiARC layer, the planarization layer, the layer of hardmask material and scaffolding material, and the adhesion layer to the top surface of the layer of metal material. Therefore, in such embodiments, the performance of operation 108 further includes forming at least one vertical opening that extends down to the layer of metal material. The at least one vertical opening is delimited in part by adjacent ribs of scaffolding material.

In accordance with at least one embodiment of the present disclosure, the performance of operation 108 further includes removing the photoresist layer.

Figure 2D:
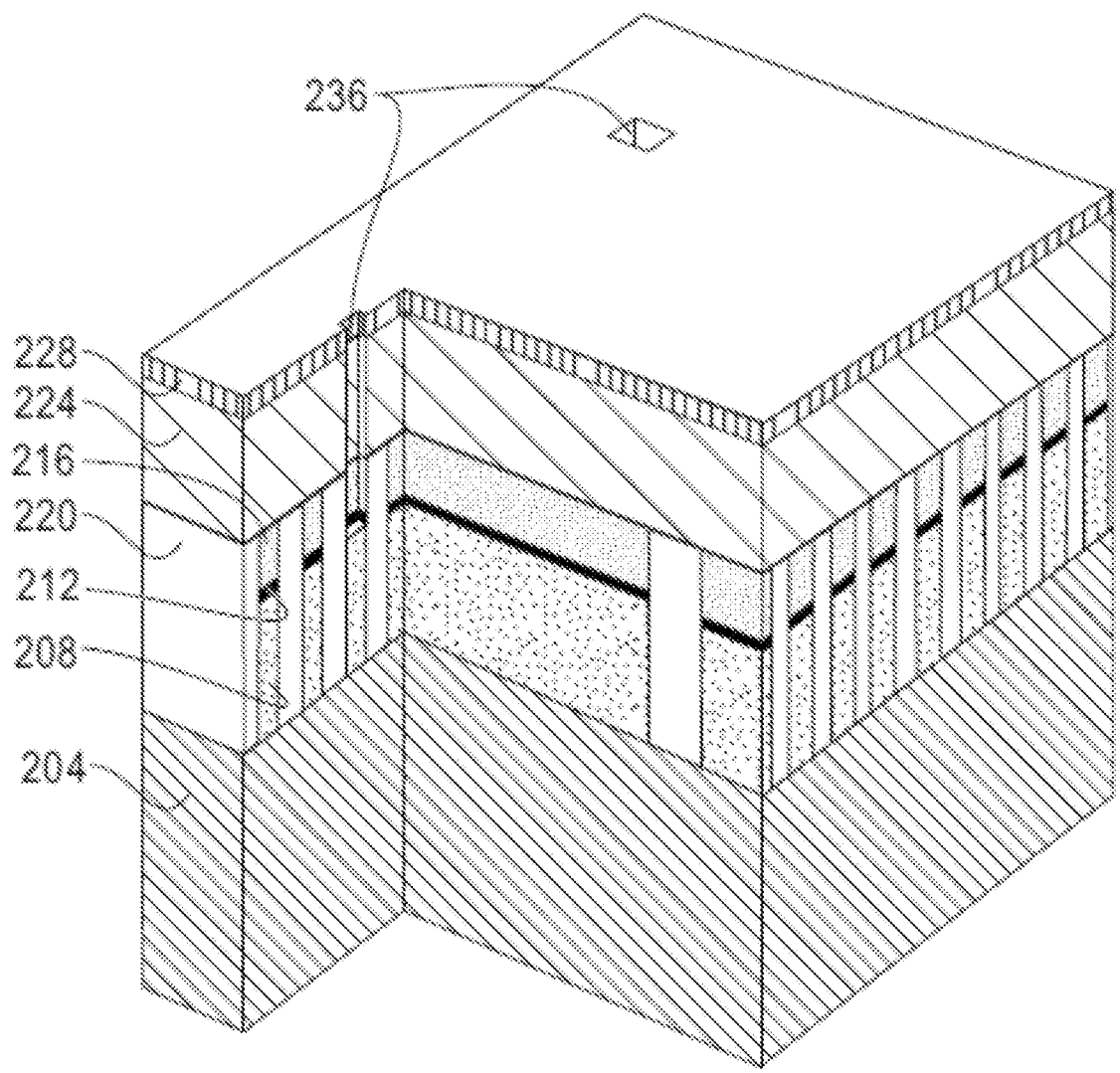
FIG. 2D illustrates an example of a component following the performance of a portion of the example method of FIG. 1, in accordance with embodiments of the present disclosure.

FIG. 2D depicts the structure 200 following the performance of these sub-operations of operation 108. As shown, the structure 200 includes vertical openings 236 aligned with the locations of the openings 234 in the photoresist layer 232 (shown in FIG. 2C). The vertical openings 236 extend down through the SiARC layer 228, the planarization layer 224, the layer of hardmask material 216 and scaffolding material 220, and the adhesion layer 212 to the top surface of the layer of metal material 208. Therefore, the vertical openings 236 expose a portion of the top surface of the layer of metal material 208 as well as vertical portions of the SiARC layer 228, vertical portions of the planarization layer 224, vertical portions of the layer of hardmask material 216 and scaffolding material 220, and vertical portions of the adhesion layer 212. In other words, the vertical openings 236 are delimited by the exposed portions of the top surface of the layer of metal material 208 as well as the exposed vertical portions of the SiARC layer 228, the planarization layer 224, the layer of hardmask material 216 and scaffolding material 220, and the adhesion layer 212.

Returning to FIG. 1, in accordance with at least one embodiment of the present disclosure, the performance of operation 108 further includes partially filling the at least one vertical opening with additional scaffolding material. In particular, the at least one vertical opening is filled with additional scaffolding material so as to cover the exposed top surface of the layer of metal material, to cover the exposed vertical surfaces of the adhesion layer, to cover the exposed vertical surfaces of the adjacent ribs of scaffolding material, to cover the exposed vertical surfaces of the layer of scaffolding material, and to partially cover the exposed vertical surfaces of the planarization layer. In accordance with at least one embodiment, the additional scaffolding material is the same material as the scaffolding material. However, in accordance with at least one alternative embodiment, the additional scaffolding material can be a different material than the scaffolding material.

The particular height to which the additional scaffolding material fills the at least one vertical opening can be selected and optimized based on the particular aspect ratio, structural stability, and downstream requirements of the application of the BEOL component. The additional scaffolding material forms the plugs, each of which is integrally formed with at least one rib of the scaffolding material and extends to the top of the layer of metal material. In accordance with at least one embodiment, the plugs extend vertically above the top surface of the hardmask material and the scaffolding material. In such embodiments, the taller plugs provide additional mask height available for further downstream processing, particularly subsequent metal recessing and/or sacrificial material removal. In accordance with at least one alternative embodiment, the additional scaffolding material can be substantially co-planar with the top surface of the hardmask material and the scaffolding material. In either case, the height of the plugs must be sufficient to act as a mask during subsequent fabrication processes.

In accordance with at least one embodiment, the additional scaffolding material that forms the plugs can be a different color than the scaffolding material that forms the ribs. Using different colored materials enables the plugs to act as visual markers for the vias. If the plug is a different material than the ribs, this provides further distinction between them and enables selectivity of one over the other. For example, if different materials are used for the plugs and the ribs, then the ribs can be recessed partially down in a selective manner relative to the plugs. This can provide a favorable structure for the metal recess etch, exposing the top portion of the metal lines, resulting in favorable profiles. Since the plugs are a different material than the ribs, it will remain to be used as a masking material during the metal recess.

Figure 2E:
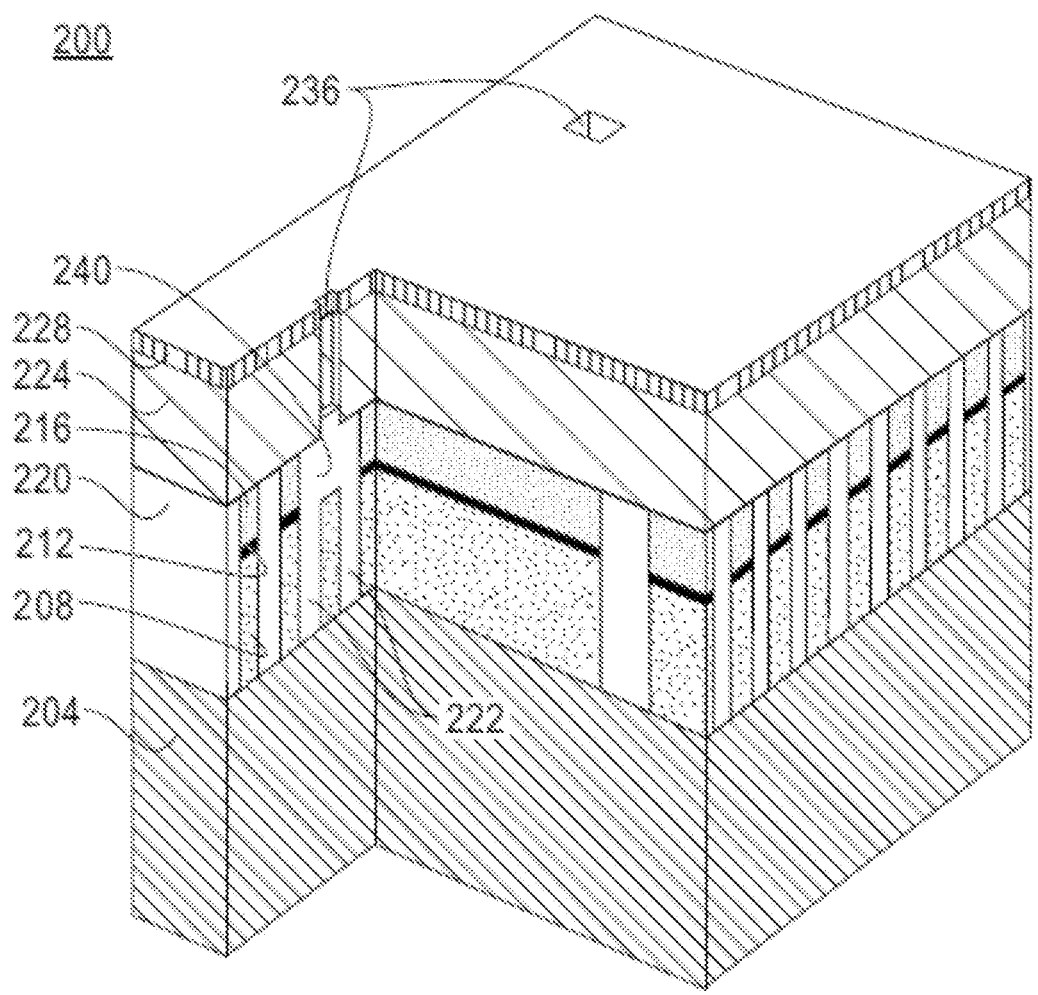
FIG. 2E illustrates an example of a component following the performance of a portion of the example method of FIG. 1, in accordance with embodiments of the present disclosure.

FIG. 2E depicts the example structure 200 following the performance of this sub-operation of operation 108. As shown, the vertical openings 236 are partially filled with additional scaffolding material, which forms a plug 240 in each of the vertical openings 236. The plugs 240 are in direct contact with the exposed portions of the top surface of the layer of metal material 208 as well as the exposed vertical portions of the planarization layer 224, the layer of hardmask material 216 and scaffolding material 220, and the adhesion layer 212. Each plug 240 is integrally formed with at least one rib 222 of scaffolding material 220.

In accordance with at least one embodiment of the present disclosure, the performance of operation 108 further includes removing the SiARC layer and the planarization layer. Following the removal of the SiARC layer and the planarization layer, the additional scaffolding material of the plugs extends above the otherwise planar top surface formed by the hardmask material and the scaffolding material or formed by only the scaffolding material.

Figure 2F:
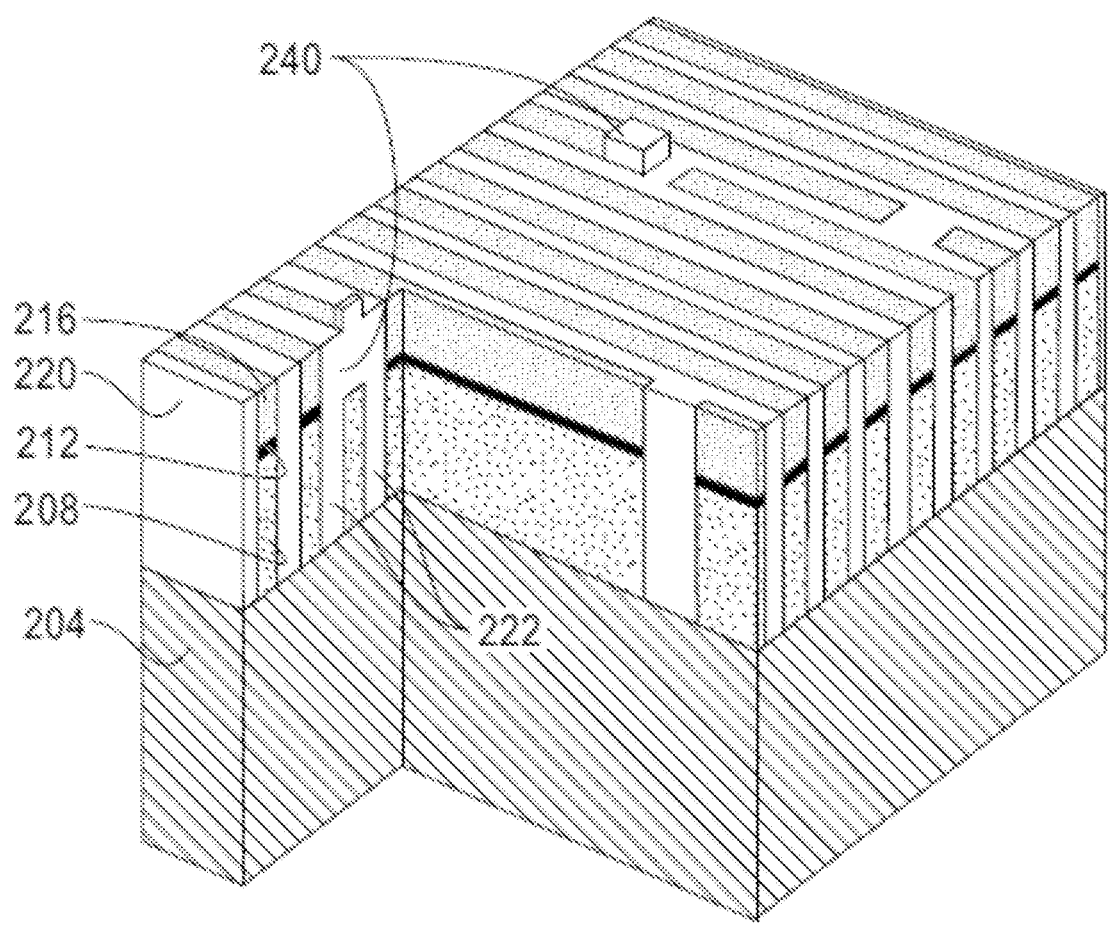
FIG. 2F illustrates an example of a component following the performance of a portion of the example method of FIG. 1, in accordance with embodiments of the present disclosure.

FIG. 2F depicts the structure 200 following the performance of this sub-operation of operation 108. More specifically, FIG. 2F depicts the structure 200 following the performance of operation 108, in accordance with some embodiments. As shown, following the performance of operation 108, the plugs 240 extend above the otherwise planar top surface formed by the hardmask material 216 and the scaffolding material 220.

Returning to FIG. 1, operation 112 includes forming further plugs of scaffolding material. The further plugs are formed in substantially the same manner as the plugs, formed by the performance of operation 108, discussed above. Accordingly, similar to operation 108, the performance of operation 112 includes the performance of a number of sub-operations.

In particular, in accordance with at least one embodiment of the present disclosure, the performance of operation 112 includes forming a further planarization layer in direct contact with the top surface of the scaffolding material. For embodiments in which the top surface of the scaffolding material is substantially co-planar with the top surface of the layer of hardmask material, the planarization layer is also applied such that it is in direct contact with the top surface of the hardmask material.

In accordance with at least one embodiment of the present disclosure, the performance of operation 112 further includes applying a further SiARC layer in direct contact with the further planarization layer.

In accordance with at least one embodiment of the present disclosure, the performance of operation 112 further includes applying a further photoresist layer in direct contact with the further SiARC layer. The further photoresist layer includes a further pattern having at least one further opening, which will be transferred down through the further SiARC layer, through the further planarization layer, through the layer of hardmask material, and through the adhesion layer to the top surface of the layer of metal material.

In accordance with at least one embodiment of the present disclosure, the performance of operation 112 further includes transferring the further pattern of the further photoresist layer down through the further SiARC layer, the further planarization layer, the layer of hardmask material and scaffolding material, and the adhesion layer to the top surface of the layer of metal material. Therefore, in such embodiments, the performance of operation 112 further includes forming at least one further vertical opening that extends down to the layer of metal material. The at least one further vertical opening is delimited in part by at least one rib of scaffolding material.

In accordance with at least one embodiment of the present disclosure, the performance of operation 112 further includes removing the further photoresist layer.

In accordance with at least one embodiment of the present disclosure, the performance of operation 112 further includes partially filling the at least one further vertical opening with additional scaffolding material. In particular, the at least one further vertical opening is filled with additional scaffolding material so as to cover the exposed top surface of the layer of metal material, to cover the exposed vertical surfaces of the adhesion layer, to cover the exposed vertical surfaces of the ribs of scaffolding material, to cover the exposed vertical surfaces of the layer of scaffolding material, and to partially cover the exposed vertical surfaces of the further planarization layer. In accordance with at least one embodiment, the additional scaffolding material is the same material as the scaffolding material. However, in accordance with at least one alternative embodiment, the additional scaffolding material can be a different material than the scaffolding material.

The particular height to which the additional scaffolding material fills the at least one vertical opening can be selected and optimized based on the particular aspect ratio, structural stability, and downstream requirements of the application of the BEOL component. The additional scaffolding material forms the further plugs, each of which is integrally formed with at least one rib of the scaffolding material and extends to the top of the layer of metal material. In accordance with at least one embodiment, the further plugs extend vertically above the top surface of the hardmask material and the scaffolding material. In accordance with at least one alternative embodiment, the additional scaffolding material can be substantially co-planar with the top surface of the hardmask material and the scaffolding material. In either case, the height of the further plugs must be sufficient to act as a mask during subsequent fabrication processes.

In accordance with at least one embodiment, the additional scaffolding material that forms the further plugs can be a different color than the scaffolding material that forms the ribs and the plugs. Using different colored materials enables the further plugs to act as visual markers for the vias.

Figure 2G:
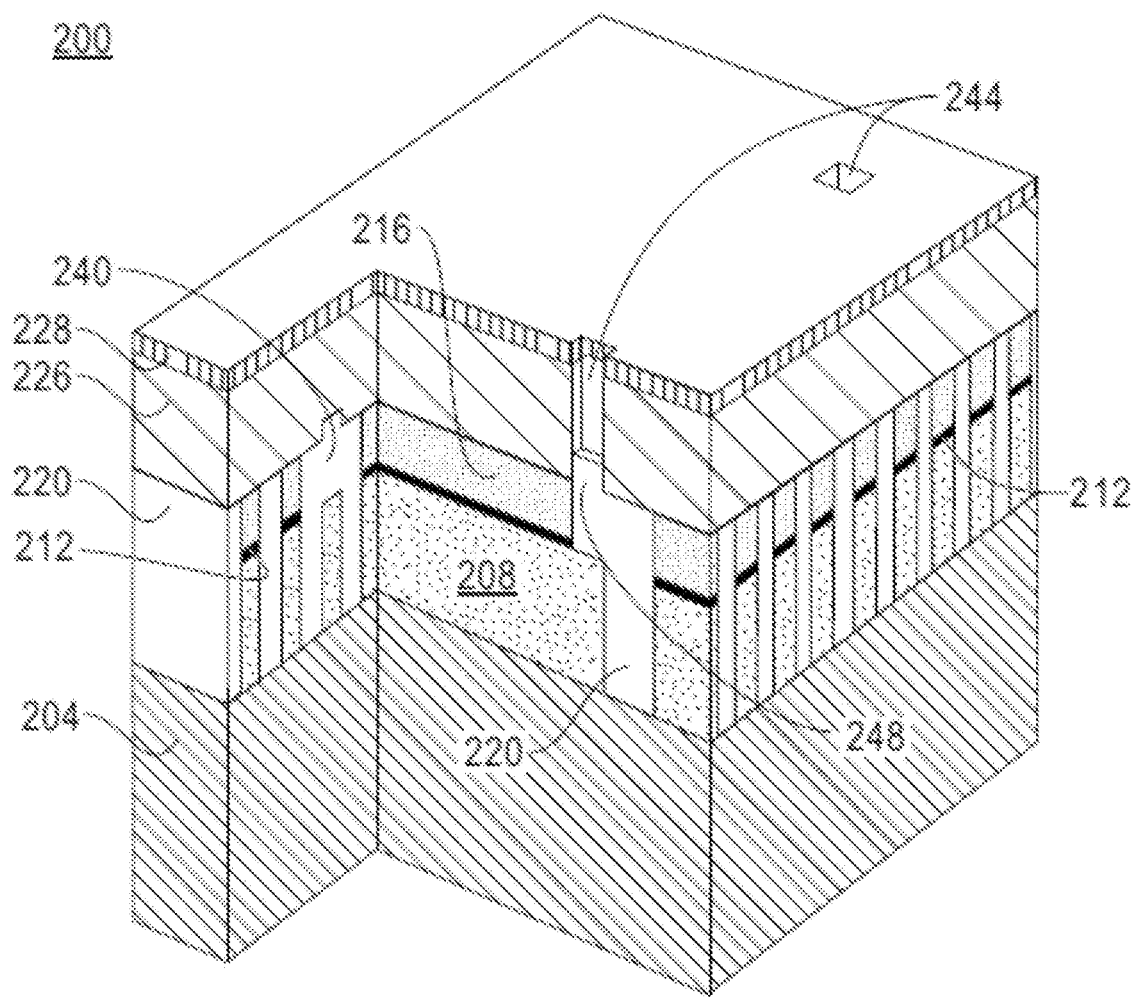
FIG. 2G illustrates an example of a component following the performance of a portion of the example method of FIG. 1, in accordance with embodiments of the present disclosure.

FIG. 2G depicts the example structure 200 following the performance of these sub-operations of operation 112. As shown, each of the further vertical openings 244 is partially filled with additional scaffolding material, which forms a further plug 248. The further plugs 248 are in direct contact with the exposed portions of the top surface of the layer of metal material 208 as well as the exposed vertical portions of the further planarization layer 226, the layer of hardmask material 216 and scaffolding material 220, and the adhesion layer 212. The further plugs 248 are integrally formed with the scaffolding material 220.

In accordance with at least one embodiment of the present disclosure, the performance of operation 112 further includes removing the further SiARC layer and the further planarization layer. Following the removal of the further SiARC layer and the further planarization layer, the additional scaffolding material of the further plugs extends above the otherwise planar top surface formed by the hardmask material and the scaffolding material or formed by only the scaffolding material.

Figure 2H:
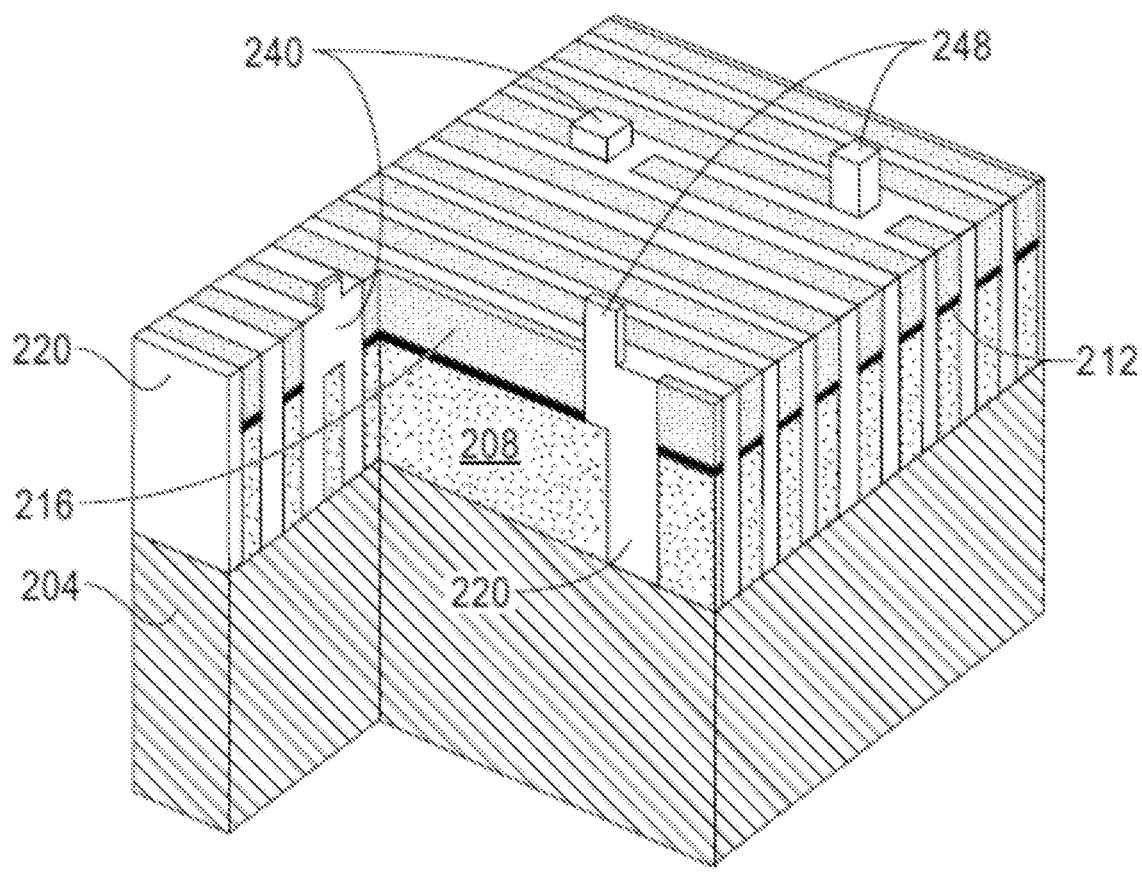
FIG. 2H illustrates an example of a component following the performance of a portion of the example method of FIG. 1, in accordance with embodiments of the present disclosure.
Figure 21:
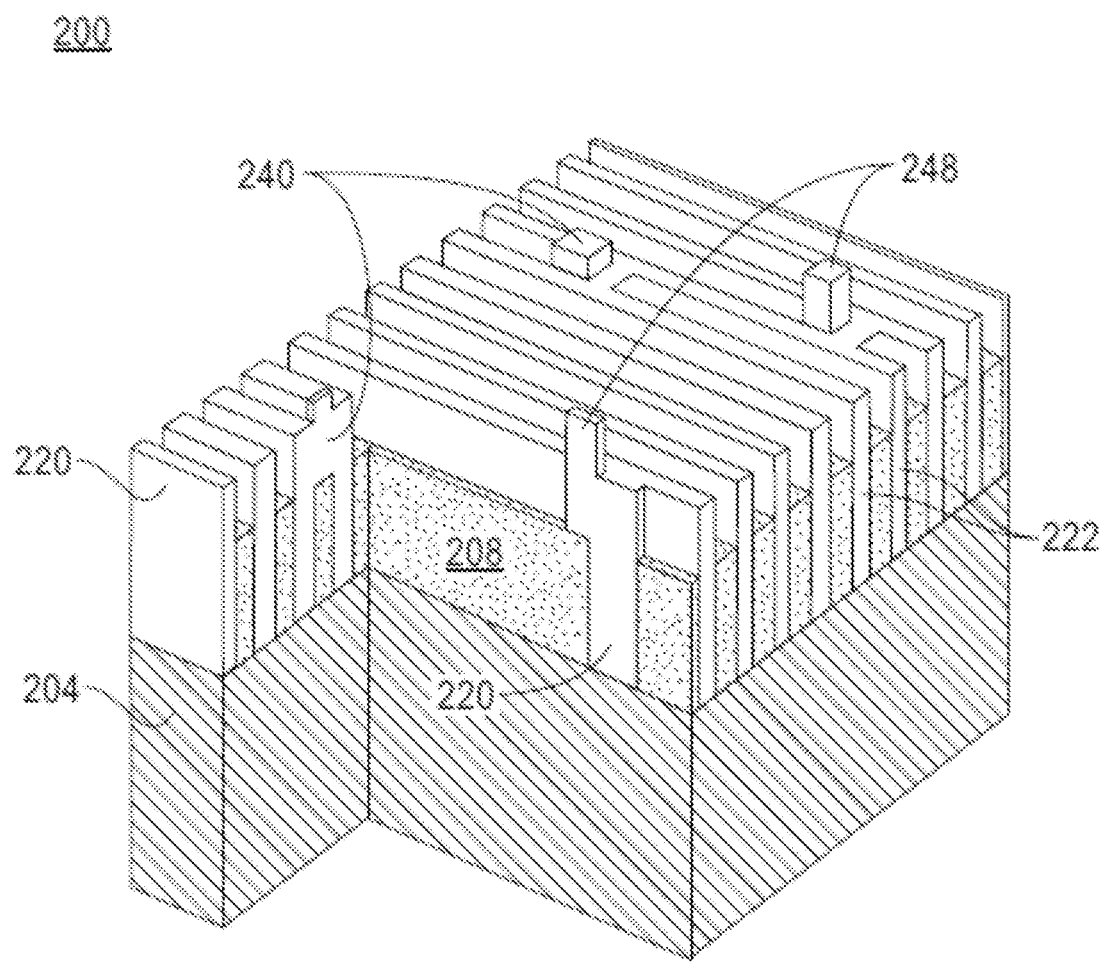

FIG. 2H depicts the structure 200 following the performance of this sub-operation of operation 112. More specifically, FIG. 2H depicts the structure 200 following the performance of operation 112, in accordance with some embodiments. As shown, following the performance of operation 112, the plugs 240 and the further plugs 248 extend above the otherwise planar top surface formed by the hardmask material 216 and the scaffolding material 220.

In accordance with at least one alternative embodiment, the method 100 can include forming plugs by performing operation 108 and can omit forming further plugs by omitting the performance of operation 112. In particular, if the arrangement of vias in the interconnect structure is relatively sparse, it may be possible to form all of the desired vias by performing only operation 108. However, performing both operations 108 and 112 enables the formation of vias at a higher density by forming some vias during operation 108 and forming some vias during operation 112. This is especially useful at such small pitches due to practical fabrication and tolerance constraints. In particular, for example, lithography processes are limited in terms of how close the vias can be to one another, which limits the minimum distance that can exist between the vias in a single exposure. Accordingly, in accordance with at least one alternative embodiment, the method 100 may also include the performance of additional iterations of the operations 108 or 112 to achieve the desired via density.

Additionally, performing both operations 108 and 112 enables the formation of plugs having a height that is different than a height of the further plugs. Accordingly, vias in the same interconnect structure that have different downstream requirements, for example aspect ratio and structural stability, can be accommodated by forming corresponding plugs of different heights.

Returning to FIG. 1, at operation 116 of the method 100, the metal material is recessed. In accordance with at least one embodiment of the present disclosure, the performance of operation 116 includes the performance of a number of sub-operations.

In particular, in accordance with at least one embodiment of the present disclosure, the performance of operation 116 includes removing the layer of hardmask material and the adhesion layer. In accordance with at least one embodiment, removing the layer of hardmask material may include performing a dry etch procedure. For example, a chlorine based chemistry etch may be used for the removal of a titanium nitride hardmask material. In accordance with at least one embodiment, removing the layer of hardmask material may include performing a wet etch procedure. For example, a SC1 solution may be used for the removal of a titanium nitride hardmask material. In either case, the etch is selective to the scaffolding material. Accordingly, the hardmask material and the adhesion layer may be removed without impacting the metal material or the scaffolding material.

FIG. 2I depicts the example structure 200 following the performance of this sub-operation of operation 116. As shown, the hardmask material 216 and the adhesion layer 212 (shown in FIG. 2H) have been removed. Accordingly, only the scaffolding material 220, including the ribs 222 as well as the plugs 240 and further plugs 248 which are integrally formed with the ribs 222, and the layer of metal material 208 remain on the substrate 204.

Returning to FIG. 1, in accordance with at least one embodiment of the present disclosure, the performance of operation 116 further includes recessing the metal material. More specifically, the height of the layer of metal material relative to the substrate is reduced by removing a portion of the metal material from the top. The plugs and further plugs of the scaffolding material act as a mask for the removal of the metal material. In particular, portions of the layer of metal material that are arranged directly beneath the plugs and further plugs are not recessed, and portions of the layer of metal material that are not arranged directly beneath the plugs and further plugs are recessed.

As a result of the performance of operation 116 of the method 100, the portions of the layer of metal material that are not recessed are taller than the portions of the layer of metal material that are recessed. These taller portions form the vias and the recessed portions of the layer of metal material form the lines of the interconnect structures of the BEOL component.

Figure 2J:
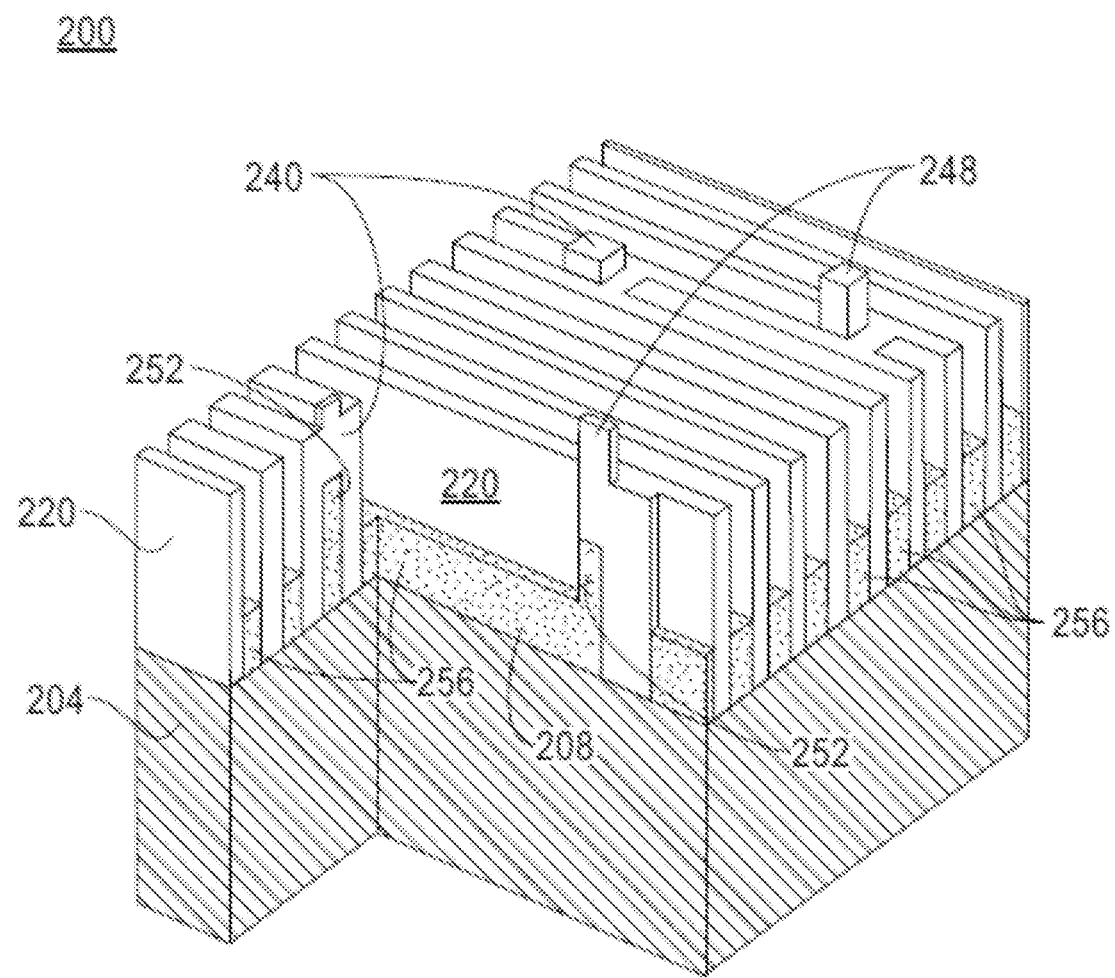
FIG. 2J illustrates an example of a component following the performance of a portion of the example method of FIG. 1, in accordance with embodiments of the present disclosure.

FIG. 2J depicts the example structure 200 following the performance of operation 116 of the method 100. As shown, the height of the layer of metal material 208 is reduced where it is not arranged directly beneath a plug 240 or further plug 248 of scaffolding material 220. The resulting taller portions of the metal material 208 form vias 252, and the recessed portions form the lines 256 of the example interconnect structure.

Returning to FIG. 1, at operation 120 of the method 100, the remaining metal material is encapsulated in an ultra-low-k (ULK) dielectric material. In other words, the lines and vias that form the interconnect structures of the BEOL component are encapsulated in a ULK material. In accordance with at least one embodiment of the present disclosure, the performance of operation 120 includes the performance of a number of sub-operations.

In accordance with at least one embodiment of the present disclosure, the performance of operation 120 includes removing the scaffolding material prior to encapsulating the metal material. Removing the scaffolding material exposes the top surfaces of all of the remaining metal material, vertical surfaces of the remaining metal material, and the top surface of the substrate in the spaces between the remaining metal material.

In accordance with at least one embodiment of the present disclosure, the performance of operation 120 includes forming a layer of ULK material on top of the remaining structure, following the removal of the scaffolding material. Accordingly, the ULK material is in direct contact with the exposed top surfaces of all of the remaining metal material, the exposed vertical surfaces of the remaining metal material, and the exposed top surface of the substrate in the spaces between the remaining metal material.

In accordance with at least one embodiment of the present disclosure, the performance of operation 120 further includes planarizing the top surface of the ULK material such that the top surfaces of the vias are exposed. In other words, the top surface of the ULK material is planarized such that it is substantially co-planar with the top surfaces of the taller portions of the metal material. In accordance with at least one alternative embodiment, it is possible to form the layer of ULK material so as to be substantially co-planar with the top surfaces of the taller portions of the metal material without subsequent planarization. However, performing planarization increases the likelihood of achieving a planar top surface of the structure.

Figure 2K:
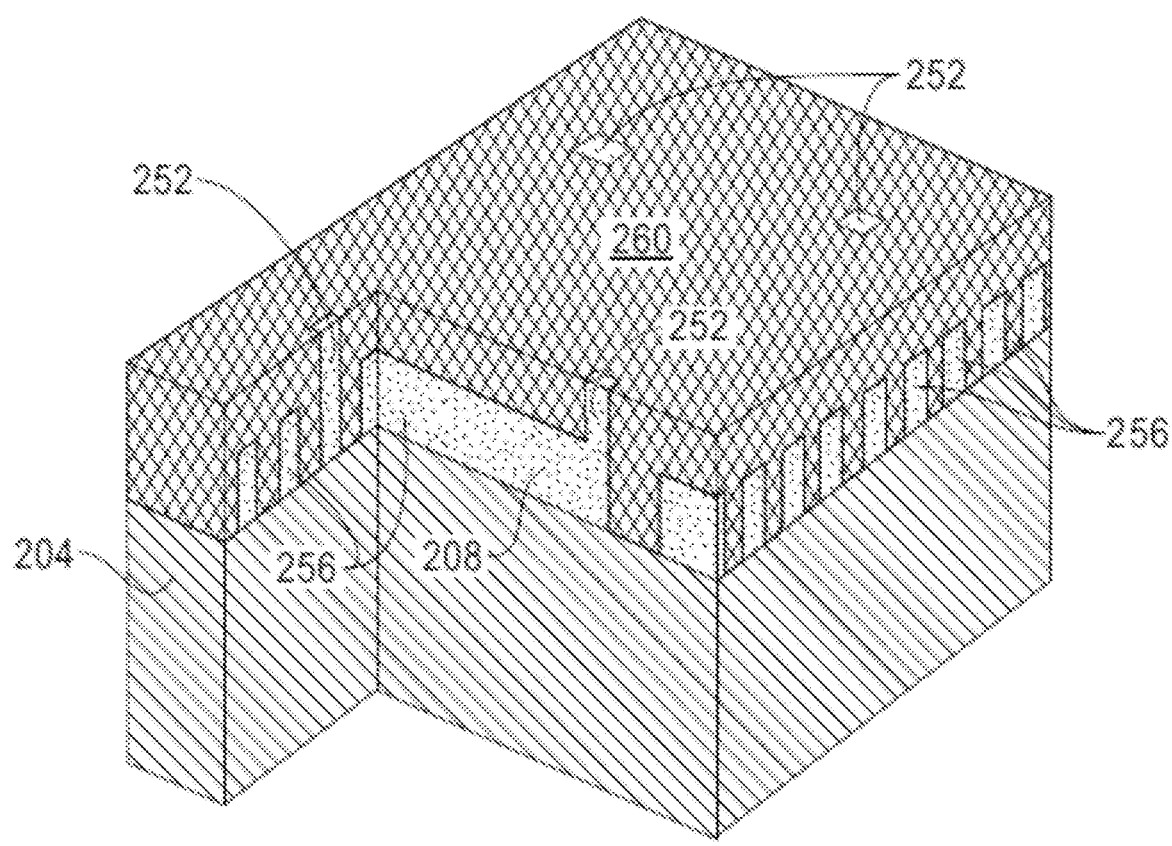
FIG. 2K illustrates an example of a component following the performance of a portion of the example method of FIG. 1, in accordance with embodiments of the present disclosure.

FIG. 2K depicts the example structure 200 following the performance of operation 120. As shown, the scaffolding material 220 (shown in FIG. 2J) has been removed and a layer of ULK material 260 has been formed in direct contact with the exposed top surfaces of all of the vias 252 and lines 256, the exposed vertical surfaces of the vias 252 and lines 256, and the exposed top surface of the substrate 204 in the spaces between the vias 252 and lines 256. Additionally, the ULK material 260 has been planarized such that it is substantially co-planar with the top surfaces of the vias 252. The height of each of the vias 252 is equal to the initial height of the layer of metal material 208 (prior to recessing). Accordingly, the top surface of each of the vias 252 is substantially equal.

The scaffolding material is removed late in the performance of the method 100. More specifically, the only procedures performed after the removal of the scaffolding material are the encapsulation of the metal material and the planarization of the top surface of the structure. The ability to leave the scaffolding material in place for so much of the process allows the scaffolding material to provide structural support to the metal material and to the hardmask material and to the plugs and further plugs of the scaffolding material for the performance of nearly the entire method.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method of making a back-end-of-line (BEOL) component, comprising:
    filling spaces in a layer of metal material and a layer of hardmask material with a layer of scaffolding material;
    forming at least one plug on top of the layer of metal material such that the at least one plug is integrally formed with the layer of scaffolding material;
    removing the layer of hardmask material such that a top surface of the layer of metal material is exposed except where the at least one plug is formed on top of the layer of metal material;
    recessing the layer of metal material where the top surface of the layer of metal material is exposed; and
    removing the scaffolding material.

2. The method of claim 1, further comprising:
    depositing the layer of metal material onto a substrate;
    depositing the layer of hardmask material onto the layer of metal material; and
    patterning the layer of metal material and the layer of hardmask material to form the spaces.

3. The method of claim 1, wherein forming the at least one plug includes:
    removing a portion of the layer of hardmask material to expose a portion of the layer of metal material; and
    covering the exposed portion of the layer of metal material with the at least one plug.

4. The method of claim 3, wherein covering the exposed portion of the layer of metal material includes forming the at least one plug in direct contact with the layer of metal material.

5. The method of claim 1, further comprising:
    encapsulating the layer of metal material in an ultra-low-k dielectric material.

6. The method of claim 1, further comprising:
    forming at least one further plug on top of the layer of metal material such that the at least one further plug is integrally formed with the layer of scaffolding material, wherein:
    removing the layer of hardmask material includes removing the layer of hardmask material such that the top surface of the layer of metal material is exposed except where the at least one plug and the at least one further plug are formed on top of the layer of metal material.

7. The method of claim 6, wherein forming the at least one further plug includes:
    removing a further portion of the layer of hardmask material to expose a further portion of the layer of metal material; and
    covering the exposed further portion of the layer of metal material with the at least one further plug.

8. A computerized system for making a back-end-of-line (BEOL) component, comprising:
    a memory; and
    a processor communicatively coupled to the memory, wherein the processor is configured to perform a method comprising:
        filling spaces in a layer of metal material and a layer of hardmask material with a layer of scaffolding material;
        forming at least one plug on top of the layer of metal material such that the at least one plug is integrally formed with the layer of scaffolding material;
        removing the layer of hardmask material such that a top surface of the layer of metal material is exposed except where the at least one plug is formed on top of the layer of metal material;
        recessing the layer of metal material where the top surface of the layer of metal material is exposed; and
        removing the scaffolding material.

9. The system of claim 8, wherein the method further comprises:
    depositing the layer of metal material onto a substrate;
    depositing a layer of hardmask material onto the layer of metal material; and
    patterning the layer of metal material and the layer of hardmask material to form the spaces.

10. The system of claim 8, wherein forming the at least one plug includes:
    removing a portion of the layer of hardmask material to expose a portion of the layer of metal material; and
    covering the exposed portion of the layer of metal material with the at least one plug.

11. The system of claim 10, wherein covering the exposed portion of the layer of metal material includes forming the at least one plug in direct contact with the layer of metal material.

12. The system of claim 8, wherein the method further comprises encapsulating the layer of metal material in an ultra-low-k dielectric material.

13. The system of claim 8, wherein:
    the method further comprises forming at least one further plug on top of the layer of metal material such that the at least one further plug is integrally formed with the layer of scaffolding material, and removing the layer of hardmask material includes removing the layer of hardmask material such that the top surface of the layer of metal material is exposed except where the at least one plug and the at least one further plug are formed on top of the layer of metal material.

14. The system of claim 13, wherein forming the at least one further plug includes:

removing a further portion of the layer of hardmask material to expose a further portion of the layer of metal material; and covering the exposed further portion of the layer of metal material with the at least one further plug.

15. A method for making a back-end-of-line (BEOL) component, the method comprising:

depositing a metal layer on a substrate;

patterning the metal layer to form one or more conductive elements;

forming a scaffolding structure including a plug arranged on top of a portion of the patterned metal layer;

selectively recessing the metal layer such that the portion of the patterned metal layer covered by the plug is not recessed; and removing the scaffolding structure.

16. The method of claim 15, wherein patterning the metal layer includes depositing a layer of hardmask material onto the metal layer and patterning the layer of hardmask material.

17. The method of claim 16, wherein forming the scaffolding structure including the plug includes:

removing a portion of the patterned layer of hardmask material to expose a portion of the patterned metal layer; and covering the exposed portion of the patterned metal layer with the plug.

18. The method of claim 17, wherein covering the exposed portion of the patterned metal layer includes forming the plug in direct contact with the patterned metal layer.

19. The method of claim 16, further comprising:

forming a further plug arranged on top of a further portion of the patterned metal layer such that the further plug is integrally formed with the scaffolding structure, and selectively recessing the metal layer such that the further portion of the patterned metal layer covered by the further plug is not recessed.

20. The method of claim 19, wherein forming the further plug includes:

removing a further portion of the patterned layer of hardmask material to expose a further portion of the patterned metal layer; and covering the exposed further portion of the patterned metal layer with the further plug.

* * * * *